United States Patent
Lehman et al.

(10) Patent No.: US 9,485,890 B2
(45) Date of Patent: Nov. 1, 2016

(54) ELECTRICAL CONNECTOR SYSTEM

(71) Applicant: Tyco Electronics Corporation, Berwyn, PA (US)

(72) Inventors: Nathan Glenn Lehman, Harrisburg, PA (US); Jeffrey Stewart Simpson, Mechanicsburg, PA (US); Christopher David Ritter, Hummelstown, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 298 days.

(21) Appl. No.: 14/201,281

(22) Filed: Mar. 7, 2014

(65) Prior Publication Data

US 2015/0257304 A1    Sep. 10, 2015

(51) Int. Cl.
*H02B 1/20* (2006.01)
*H05K 7/20* (2006.01)
*H05K 7/14* (2006.01)

(52) U.S. Cl.
CPC ........ *H05K 7/20736* (2013.01); *H05K 7/1491* (2013.01)

(58) Field of Classification Search
CPC ............ H05K 5/00; H05K 7/00; H05K 7/18; H05K 7/20; G06F 1/20
USPC .......... 361/826, 107, 614, 679.33, 695, 727, 361/733, 752; 312/236, 349, 352; 126/85 B
See application file for complete search history.

(56) References Cited

U.S. PATENT DOCUMENTS

| | | | | |
|---|---|---|---|---|
| 3,815,913 A * | 6/1974 | Wren | ......................... | F41J 5/10 463/57 |
| 6,075,698 A * | 6/2000 | Hogan | ................ | H05K 7/20581 165/104.34 |
| 6,086,598 A * | 7/2000 | Appelbaum | ......... | G06F 19/3406 604/118 |
| 6,175,503 B1 * | 1/2001 | Hogan | ................... | H02M 7/003 312/349 |
| 6,251,113 B1 * | 6/2001 | Appelbaum | ............ | A61B 17/00 604/22 |
| 6,404,642 B1 * | 6/2002 | Greenfield | ........... | G11B 33/022 361/679.33 |
| 2004/0169374 A1 * | 9/2004 | Wurtele | ............. | B60H 1/00378 290/1 A |
| 2005/0207129 A1 * | 9/2005 | Fiorentino | ............... | G06F 1/188 361/752 |
| 2005/0237724 A1 * | 10/2005 | Fiorentino | ........... | H05K 7/1457 361/752 |
| 2006/0243268 A1 * | 11/2006 | Jacklich | .................. | F23L 17/04 126/85 B |
| 2010/0152958 A1 * | 6/2010 | McAndrew, III | ....... | F01N 11/00 701/34.2 |
| 2012/0062086 A1 * | 3/2012 | Garza, Jr. | ............ | H05K 5/0247 312/236 |
| 2013/0258580 A1 * | 10/2013 | Nakayama | ........... | G11B 33/128 361/679.33 |

* cited by examiner

*Primary Examiner* — Xiaoliang Chen

(57) ABSTRACT

An electrical connector system includes a panel having a plurality of connector openings and a plurality of vent openings interspersed among the connector openings. Cable connectors are coupled to the panel and extend at least partially into the connector openings. The cable connectors have mating interfaces presented at the front for mating with mating connectors and the cable connectors have cables extending from cable ends of the cable connectors and located rearward of a rear of the panel. Air funnels are coupled to the panel at corresponding vent openings. The air funnels extend rearward of the rear of the panel. The air funnels route the cables clear of the space rearward of the vent openings to define an unimpeded flow path through the vent openings.

18 Claims, 5 Drawing Sheets

ELECTRICAL CONNECTOR SYSTEM

BACKGROUND OF THE INVENTION

The subject matter herein relates generally to electrical connector systems.

Communication systems, such as network systems, servers, data centers, and the like, use backplanes to interconnect midplanes, daughtercards, line cards and/or switch cards. To increase density and speeds through such communication systems, some backplanes have been designed as cable backplane systems, where the connectors of the backplane are connected by cables. However, thermal management of such systems has been problematic. For example, cable management is difficult and the cables at the rear of the panel of the backplane tend to block airflow to the connectors and through the panel.

A need remains for a cable backplane system that controls cable routing in an easy and reliable manner.

BRIEF DESCRIPTION OF THE INVENTION

In one embodiment, an electrical connector system is provided including a panel having a plurality of connector openings and a plurality of vent openings interspersed among the connector openings. Cable connectors are coupled to the panel and extend at least partially into the connector openings. The cable connectors have mating interfaces presented at the front for mating with mating connectors and the cable connectors have cables extending from cable ends of the cable connectors and located rearward of a rear of the panel. Air funnels are coupled to the panel at corresponding vent openings. The air funnels extend rearward of the rear of the panel. The air funnels route the cables clear of the space rearward of the vent openings to define an unimpeded flow path through the vent openings.

Optionally, the air funnels extend between a front and a rear and may be tapered between the front and the rear. The air funnels may be spaced apart from each other to define air funnel gaps and the cables may be routed in the air funnel gaps. The air funnels may be spaced apart from the cable connectors to define connector gaps and the cables may be routed in the connector gaps.

Optionally, the air funnels may include side walls and end walls. Slots may be formed in at least one of the side walls or end walls. Securing members may be received in the slots. The securing members may engage the cables to secure the cables to the air funnels. The cables may be arranged in cables bundles and the securing members may surround associated cable bundles.

Optionally, the air funnels may include a front flange at a front of the air funnel that may be held against the panel. The front flange may be held against the front of the panel. The air funnel may have a latch engaging the rear of the panel to secure the air funnel to the panel.

Optionally, the air funnels may extend between a front and a rear and may include side walls and end walls extending between the front and the rear of the air funnel. The air funnels may have a rear flange at the rear. The rear flange may contain associated cables between the rear flange and the panel. One of side walls or end walls may have a hinge allowing the air funnel to separate and open apart. The air funnels may each having a separate front flange with the side walls and/or end walls having a latch to secure the front flange to the corresponding side wall or end wall. The side walls may be split to form a first air funnel section and a second air funnel section.

In another embodiment, an electrical connector system is provided that includes a panel having a plurality of connector openings and a plurality of vent openings interspersed among the connector openings. Cable connectors are coupled to the panel and extend at least partially into the connector openings. The cable connectors have mating interfaces presented at the front of the panel for mating with mating connectors. The cable connectors have cables extending from cable ends of the cable connectors and located rearward of the rear of the panel. Air funnels are coupled to the panel at corresponding vent openings. The air funnels extend rearward of the rear of the panel. The air funnels route the cables clear of the space rearward of the vent openings to define an unimpeded flow path through the vent openings. Securing members are coupled to the air funnels. The securing members secure the cables to the air funnels.

DETAILED DESCRIPTION OF THE INVENTION

Figure 1:
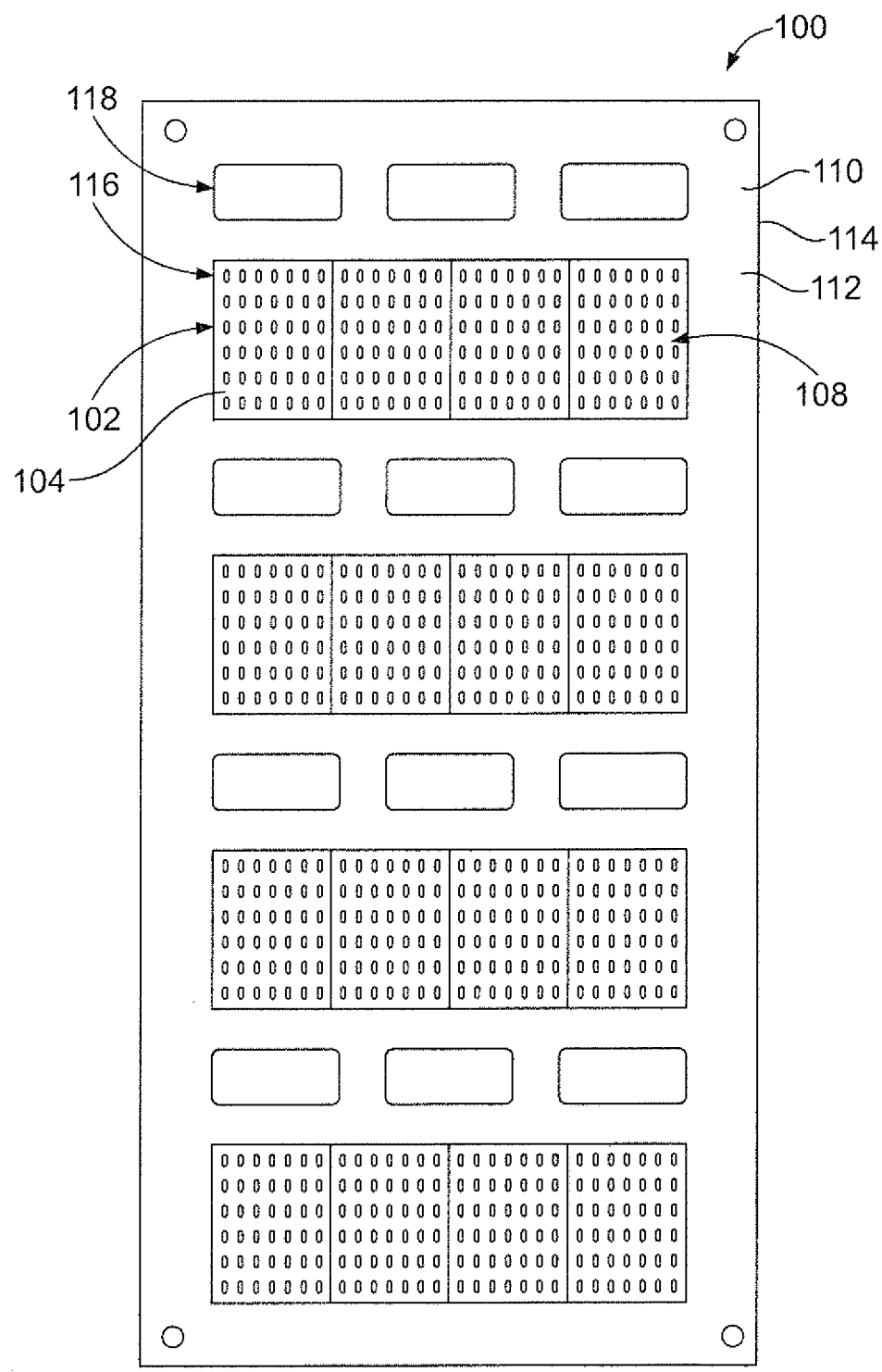
FIG. 1 is a front perspective view of an electrical connector system formed in accordance with an exemplary embodiment.

FIG. 1 is a front perspective view of an electrical connector system 100 formed in accordance with an exemplary embodiment. The electrical connector system 100 is used in a data communication application, such as a network switch. The electrical connector system 100 interconnects with daughter cards, such as line cards or switch cards, using cables connector assemblies 102. The electrical connector system 100 may be used to interconnect with other types of connectors and/or cards in other embodiments.

The cable connector assemblies 102 include cable connectors 104 that are interconnected by cables 106 (shown in FIG. 2) within the electrical connector system 100. The cable connectors 104 have mating interfaces 108 presented at the front of the panel for mating with mating connectors, such as connectors of the daughtercard. The cable connector assemblies 102 eliminate interconnects via traces of a circuit board, such as a typical backplane circuit board. The cable connector assemblies 102 have improved signal performance along the signal paths between various connectors of the electrical connector system 100 as compared to conventional backplanes. The cable connector assemblies 102 support higher speeds, longer signal path lengths and lower cost per channel as compared to conventional backplanes. The cable connector assemblies 102 provide shielding of signal lines for improved signal performance.

Figure 2:
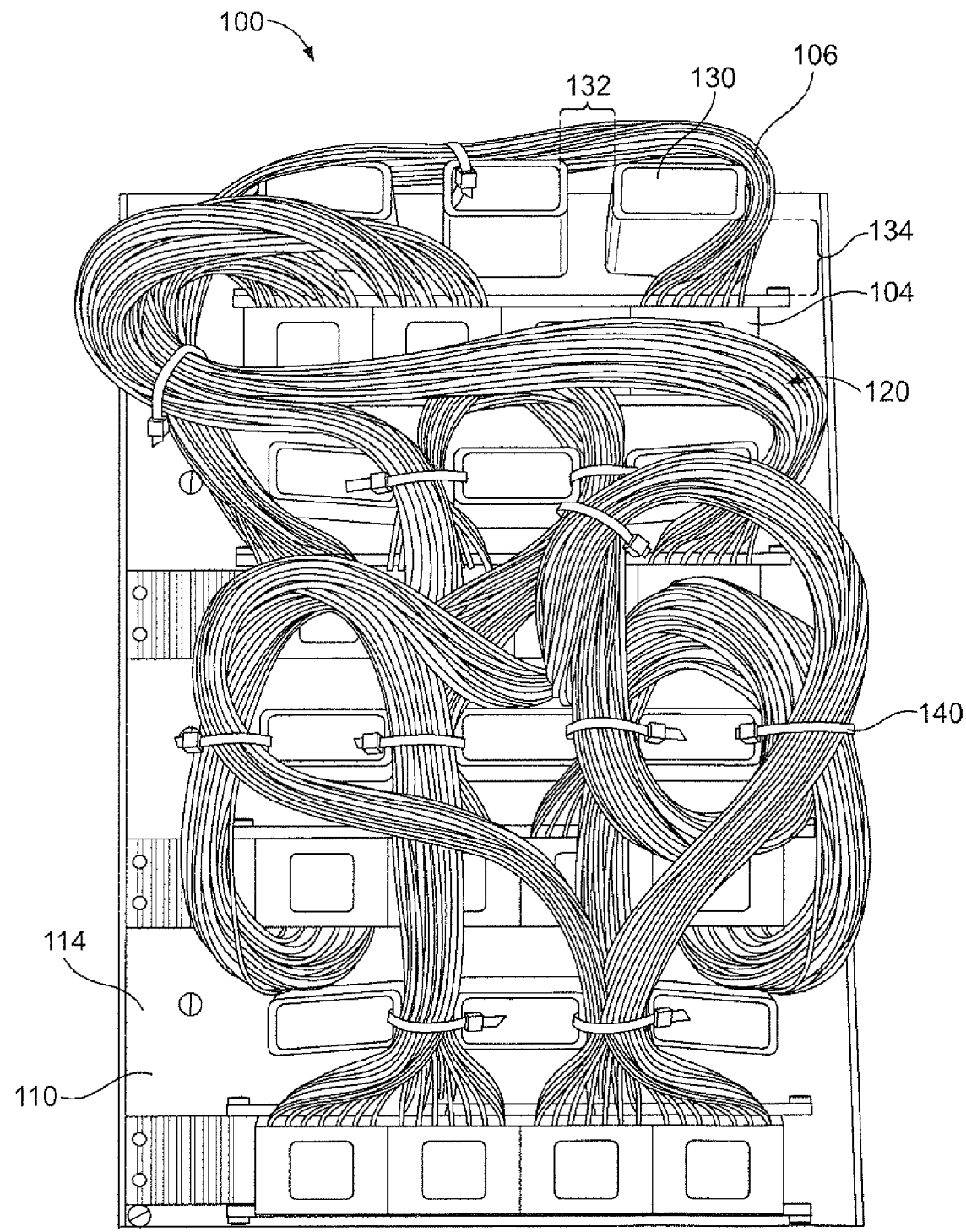
FIG. 2 is a rear view of the electrical connector system.

The electrical connector system 100 includes a panel 110 having a front 112 and a rear 114 (shown in FIG. 2). The daughtercards are mated with the cable connector 104 at the front 112. The panel 110 has a plurality of connector openings 116 therethrough. The cable connectors 104 are provided in corresponding connector openings 116 for mating with mating connectors, such as mating connectors on the line cards or switch cards. In the illustrated embodiment, each connector opening 116 receives multiple cable connectors 104 therethrough. Alternatively, the connector openings 116 may be sized to receive a single cable connector 104 as opposed to multiple cable connectors 104.

In an exemplary embodiment, the panel 110 includes a plurality of vent openings 118 interspersed among the connector openings 116. The vent openings 118 allow airflow through the panel 110 for cooling the components of the daughtercard, the cable connectors 104 and/or the cables 106. Optionally, fans may be provided in or near the vent openings 118 to increase the airflow therethrough. In the illustrated embodiment, the connector openings 116 are provided in rows, with rows of vent openings 118 positioned between each of the rows of connector openings 116. Other arrangements of the connector openings 116 and vent openings 118 are possible in alternative embodiments.

FIG. 2 is a rear view of the electrical connector system 100. The cables 106 are illustrated in FIG. 2 and the cables 106 are positioned rearward of the rear 114 of the panel 110. In an exemplary embodiment, the cables 106 interconnect various cable connectors 104. Alternatively, the cables 106 may be directed from the cable connectors 104 to other components or devices of the electrical connector system 100, such as remote from the panel 110. The cables 106 extend from the cable connectors 104 and are gathered together in cable bundles 120. Optionally, cables from different cable connectors 104 may be gathered together within the same cable bundle 120. The cable bundles 120 are routed between various cable connectors 104.

The electrical connector system 100 includes air funnels 130 to prevent the cables 106 from blocking airflow through the vent openings 118 (shown in FIG. 1). The air funnels 130 extend reward from the rear 114 of the panel 110. The air funnels 130 define airflow paths from the area behind the panel 110 to the vent openings 118. Air may flow through the air funnels 130 to cool the components on the daughtercards and/or to cool the cable connectors 104.

The air funnels 130 are interspersed among the cable connectors 104. In an exemplary embodiment, the air funnels 130 are used to guide or route the cables 106 behind the panel 110. For example, the air funnels 130 may route the cables clear of the space reward of the vent openings 118 to define an unimpeded flow path through the vent opening 118.

The air funnels 130 are spaced apart from each other to define air funnel gaps 132. The cables 106 are routed in the air funnel gaps 132 from the cable connectors 104. The air funnels 130 are spaced apart from the cable connectors 104 to define connector gaps 134. The cables 106 are routed in the connector gaps 134 to and/or from the cable connectors 104. The cables 106 may be routed from the connector gaps 134 into the air funnel gaps 132 and vice versa.

In an exemplary embodiment, securing members 140 are used to secure the cable 106 to the air funnels 130. For example, the securing members 140 may be coupled to sides of the air funnels 130 and may be coupled to the cables 106 to secure the positions of the cables 106 relative to the air funnels 130. The securing members 140 may wrap entirely around one or more cable bundles 120 to secure the cable bundles 120 to the air funnels 130. Securing the cables 106 to the air funnels 130 ensures that the cables 106 do not block the air funnels 130 to impede the flow path through the vent openings 118.

In an exemplary embodiment, the securing numbers 140 may be zip ties; however, other types of fasteners may be used in alternative embodiments, such as clips, screws, tape, adhesives and the like. Optionally, the securing members 140 may be used separate from the air funnels 130, such as to secure different cable bundles 120 to one another or to other components of the electrical connector system 100, such as to the panel 110.

Figure 3:
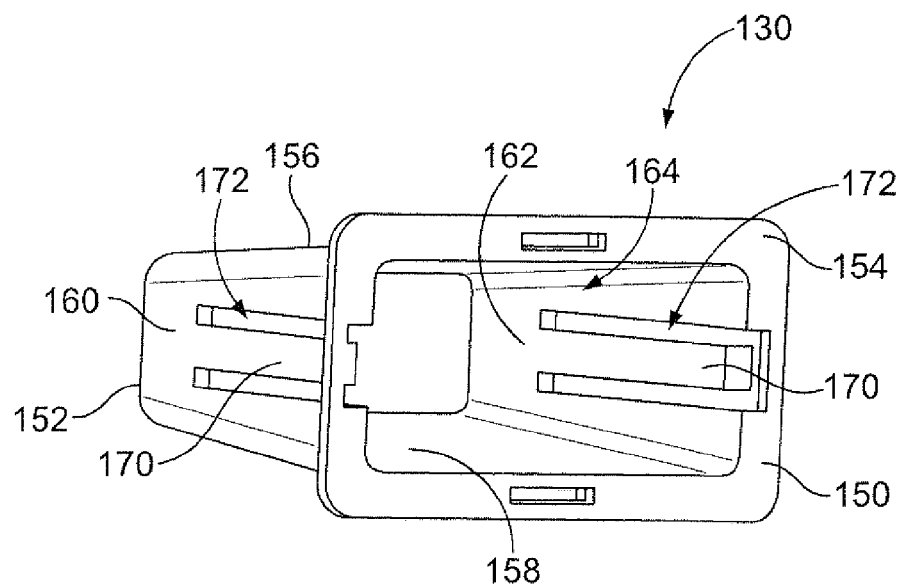
FIG. 3 is a front perspective view of an air funnel of the electrical connector system and formed in accordance with an exemplary embodiment.
Figure 4:
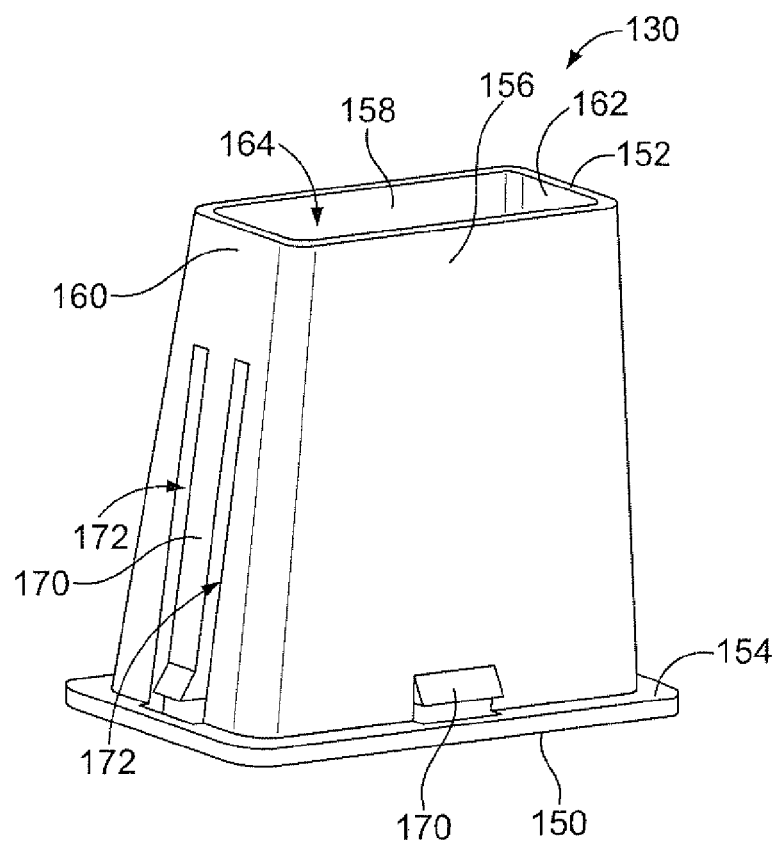
FIG. 4 is a side perspective view of the air funnel.

FIG. 3 is a front perspective view of one of the air funnels 130 formed in accordance with an exemplary embodiment. FIG. 4 is a side perspective view of the air funnel 130. The air funnel 130 extends between a front 150 and a rear 152. The air funnel 130 includes a front flange 154 at the front 150. In an exemplary embodiment, the air funnel 130 is configured to be loaded into the corresponding vent opening 118 (shown in FIG. 1) of the panel 110 (shown in FIG. 1) from the front of the panel 110. The air funnel 130 is loaded into the vent opening 118 until the front flange 154 engages the panel 110. Alternatively, the front flange 154 may abut against the rear 114 (shown in FIG. 2) of the panel 110.

The air funnel 130 includes side walls 156, 158 extending between the front 150 and the rear 152. The air funnel 130 includes end walls 160, 162 extending between the front 150 and the rear 152. The end walls 160, 162 connect the side walls 156, 158 and the corners may be rounded. More or less walls may be provided in alternative embodiments. The side walls 156, 158 and end walls 160, 162 define a cavity 164 through which the air may flow. Optionally, the side walls 156, 158 and/or the end walls 160, 162 may be tapered from the front 150 to the rear 152 such that the cavity 164 is larger near the front 150 and smaller near the rear 152. The cavity 164 may have a generally rectangular cross section; however the cavity 164 may have other shapes in alternative embodiments, such as an oval shape, a circular shape, a non-uniform shape, and the like. The air funnel 130 is open at the front 150 and the rear 152 to define the airflow path through the air funnel 130.

The air funnel 130 includes latches 170 extending from the side walls 156, 158 and/or the end walls 160, 162. The latches 170 are used to secure the air funnel 130 to the panel 110. In an exemplary embodiment, the panel 110 may be captured between the front flange 154 and the latches 170. For example, the front flange 154 may engage the front 112 (shown in FIG. 1) of the panel 110 while the latches 170 engage the rear 114 (shown in FIG. 2) of the panel 110. Optionally, the latches 170 may be deflectable. For example, in the illustrated embodiment, the latches 170 in the end walls 160, 162 are cantilevered beams that may be deflected into the cavity 164 as the air funnel 140 is loaded through the corresponding vent opening 118 (shown in FIG. 1) of the panel 110 until the latches 170 snap into a latched position behind the panel 110.

In an exemplary embodiment, the air funnel 130 includes a plurality of openings or slots 172 in the side walls 156, 158 and/or the end walls 160, 162. For example, the slots 172 may extend along the latches 170. The slots 172 may be positioned remote from the latches 170. Optionally, the slots 172 may be positioned near the rear 152 of the air funnel 130. The slots 172 may receive the securing members 140 (shown in FIG. 2). For example, the zip ties may pass through the slots 172 and around the rear 152 of the air funnel 130 to wrap around corresponding cables 106 (shown in FIG. 2) to cinch or tighten the cables 106 against the air funnels 130. The slots 172 may allow airflow into or out of the air funnels 130, such as to increase the cooling of the cable connectors 104.

Figure 5:
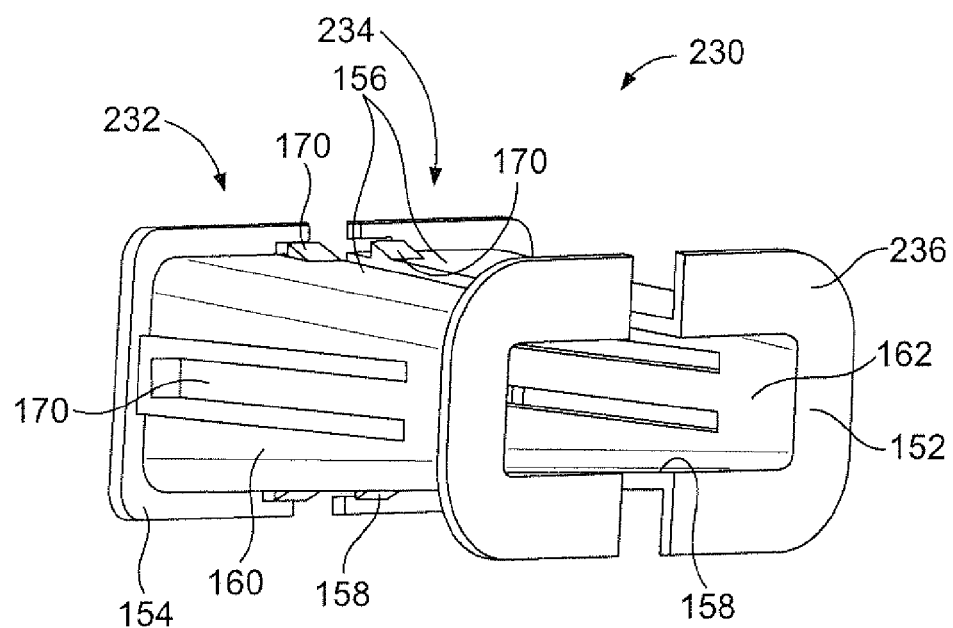
FIG. 5 illustrates an air funnel formed in accordance with an exemplary embodiment.

FIG. 5 illustrates an air funnel 230 formed in accordance with an exemplary embodiment. The air funnel 230 is similar to the air funnel 130 and like components are identified with like reference numerals. The air funnel 230 has a split-piece structure as opposed to the one piece structure of the air funnel 130. The split-piece structure allows the halves to be independently loaded through the vent opening 118 (shown in FIG. 1). The air funnel 230 includes a first air funnel section 232 and a second air funnel section 234. Optionally, the front flange 154 may be formed integral with the air funnel sections 232, 234. Optionally, the first and second air funnel sections 232, 234 may be mirrored halves of the air funnel 230.

The side walls 156, 158 are split with half of each side wall 156, 158 being formed by different air funnel sections 232, 234. Alternatively, the end walls 160, 162 may be split. The side walls 156, 158 of both air funnel sections 232, 234 have latches 170 such that both air funnel sections 232, 234 may be independently secured to the panel 110 (shown in FIG. 1). When the air funnel 230 is coupled to the panel 110, the edges of the air funnel sections 232, 234 may abut against each other. Optionally, the two air funnel sections 232, 234 may be secured together, such as with a latch, a clip, a fastener, and the like.

The air funnel 230 includes a rear flange 236 at the rear 152. The rear flange 236 may be used to contain the cables 106 (shown in FIG. 2). For example, the rear flange 236 may contain the cables 106 in the space between the rear flange 236 and the panel 110. The rear flange 236 may be used to temporarily position the cables 106 in the air funnel gaps 132 and connector gaps 134 (both shown in FIG. 2) during assembly of the electrical connector system 100 (shown in FIG. 2), such as prior to using the securing members 140 to more permanently secure the cables 106 to the air funnel 230. The rear flange 236 may stop the cables 106 from moving away from the panel 110, such as by physically blocking the cables 106. Optionally, both air funnel sections 232, 234 may include portions of the rear flange 236. The rear flange 236 may be formed integral with the air funnel sections 232, 234. Alternatively, the rear flange 236 may be a separate piece, having a ring shape, which is coupled to the rear 152 of the air funnel 230. The separate rear flange may be used to tie the air funnel sections 232, 234 together.

Figure 6:
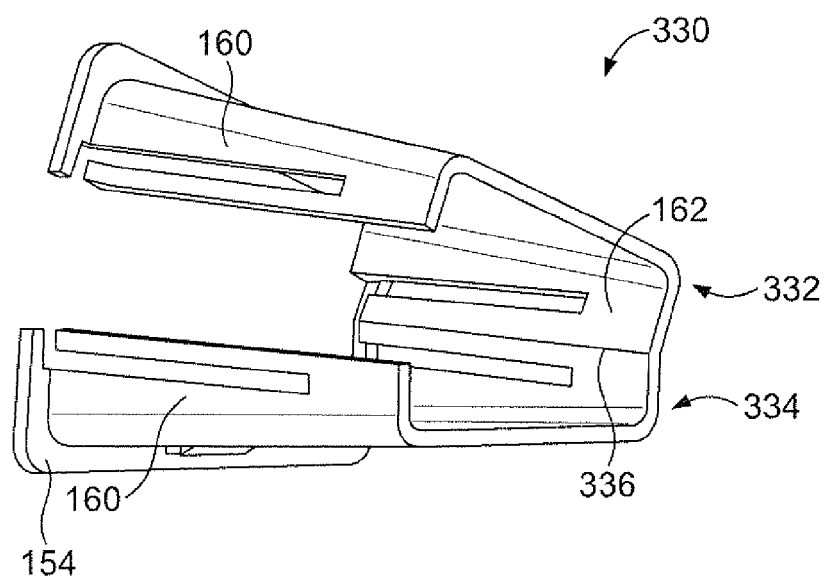
FIG. 6 illustrates an air funnel formed in accordance with an exemplary embodiment.

FIG. 6 illustrates an air funnel 330 formed in accordance with an exemplary embodiment. The air funnel 330 is similar to the air funnel 130 and like components are identified with like reference numerals. The air funnel 330 has a clam shell structure as opposed to the one piece structure of the air funnel 130. The air funnel 330 includes a first air funnel section 332 and a second air funnel section 334 connected to the first air funnel section 332 at a hinge 336. The hinge 336 allows the air funnel 330 to separate and open apart, but both air funnel sections 332, 334 can be co-molded, which lowers the overall cost of manufacturing the air funnel 330. Optionally, the first and second air funnel sections 332, 334 may be mirrored halves of the air funnel 330.

The end wall 160 is split with half of the end wall 160 being formed by different air funnel sections 332, 334. The end wall 162 includes the hinge 336. Optionally, the two air funnel sections 332, 334 may be secured together, such as with a latch, a clip, a fastener, and the like. In the illustrated embodiment, the front flange 154 is formed integral with the air funnel sections 334, 336; however the front flange 154 may be separate in alternative embodiments.

Figure 7:
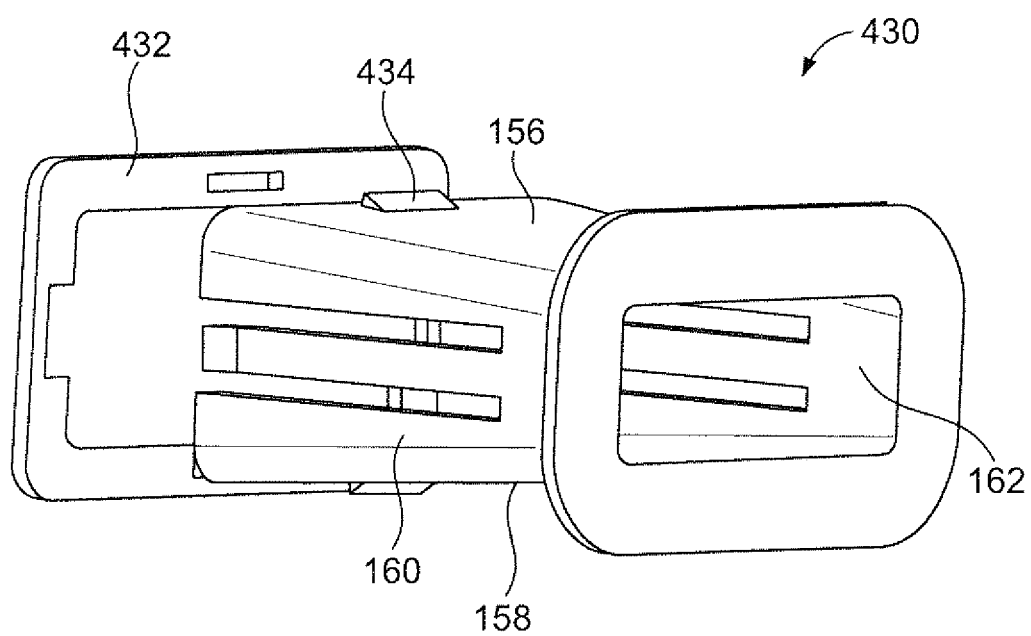
FIG. 7 illustrates an air funnel formed in accordance with an exemplary embodiment.

FIG. 7 illustrates an air funnel 430 formed in accordance with an exemplary embodiment. The air funnel 430 is similar to the air funnel 130 and like components are identified with like reference numerals. The air funnel 430 includes a separate front flange 432 that is separate from the side walls 156, 158 and end walls 160, 162. At least some of the side walls 156, 158 and end walls 160, 162 include latches 434 that are used to secure the front flange 432 to the side walls 156, 158 and end walls 160, 162. The split-piece structure allows the front flange 432 to be brought against the front 112 (shown in FIG. 1) of the panel 110 (shown in FIG. 1), while the remainder of the air funnel 430, such as the side walls 156, 158 and end walls 160, 162, are brought against the rear 114 (shown in FIG. 2) of the panel 110.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §116(f), unless and until such claim limitations expressly use the phrase "means for" followed by a statement of function void of further structure.

What is claimed is:

1. An electrical connector system comprising:
   a panel having a plurality of connector openings and a plurality of vent openings interspersed among the connector openings, the panel having a front and a rear;
   cable connectors coupled to the panel and extending at least partially into the connector openings, the cable connectors having mating interfaces presented at the front for mating with mating connectors, the cable connectors having cables extending from cable ends of the cable connectors and located rearward of the rear of the panel; and
   air funnels coupled to the panel at corresponding vent openings, the air funnels extending rearward of the rear of the panel, the air funnels routing the cables clear of the space rearward of the vent openings to define an unimpeded flow path through the vent openings, wherein the air funnels include side walls and end walls, slots being formed in at least one of the side walls or the end walls, securing members being received in the slots, the securing members engaging the cables to secure the cables to the air funnels.

2. The electrical connector system of claim 1, wherein the air funnels each extend between a front and a rear, the air funnels being tapered between the front and the rear.

3. The electrical connector system of claim 1, wherein the cables are arranged in cable bundles, the securing members surrounding associated cable bundles.

4. The electrical connector system of claim 1, wherein the air funnels are spaced apart from each other to define air funnel gaps, the cables being routed in the air funnel gaps.

5. The electrical connector system of claim 1, wherein the air funnels are spaced apart from the cable connectors to define connector gaps, the cables being routed in the connector gaps.

6. The electrical connector system of claim 1, wherein the air funnels each extend between a front and a rear, the air funnels each having a rear flange at the rear, the rear flange containing associated cables between the rear flange and the panel.

7. The electrical connector system of claim 1, wherein the air funnels each having a separate front flange, at least one of the side walls or the end walls having a latch to secure the front flange to the corresponding side wall or end wall.

8. The electrical connector system of claim 1, wherein the side walls are split to form a first air funnel section and a second air funnel section.

9. An electrical connector system comprising:
a panel having a plurality of connector openings and a plurality of vent openings interspersed among the connector openings, the panel having a front and a rear;
cable connectors coupled to the panel and extending at least partially into the connector openings, the cable connectors having mating interfaces presented at the front for mating with mating connectors, the cable connectors having cables extending from cable ends of the cable connectors and located rearward of the rear of the panel; and
air funnels coupled to the panel at corresponding vent openings, the air funnels extending rearward of the rear of the panel, the air funnels routing the cables clear of the space rearward of the vent openings to define an unimpeded flow path through the vent openings, wherein the air funnels each include a front flange at a front of the air funnel, the front flange being held against the panel.

10. The electrical connector system of claim 9, wherein the front flange is held against the front of the panel, the air funnel comprising a latch engaging the rear of the panel to secure the air funnel to the panel.

11. The electrical connector system of claim 9, wherein each of the air funnels is tapered between the front of the air funnel and a rear of the air funnel.

12. The electrical connector system of claim 9, wherein slots being formed in at least one of the side walls or the end walls, securing members being received in the slots, the securing members engaging the cables to secure the cables to the air funnels.

13. The electrical connector system of claim 12, wherein the cables are arranged in cables bundles, the securing members surrounding associated cable bundles.

14. The electrical connector system of claim 9, wherein the air funnels are spaced apart from each other to define air funnel gaps, the cables being routed in the air funnel gaps.

15. An electrical connector system composing:
a panel having a plurality of connector openings and a plurality of vent openings interspersed among the connector openings, the panel having a front and a rear;
cable connectors coupled to the panel and extending at least partially into the connector openings, the cable connectors having mating interfaces presented at the front for mating with mating connectors, the cable connectors having cables extending from cable ends of the cable connectors and located rearward of the rear of the panel; and
air funnels coupled to the panel at corresponding vent openings, the air funnels extending rearward of the rear of the panel, the air funnels routing the cables clear of the space rearward of the vent openings to define an unimpeded flow path through the vent openings, wherein the air funnels each include side walls and end walls extending between a front and a rear of the air funnel, at least one of the side walls or the end walls having a hinge allowing the air funnel to separate and open apart.

16. The electrical connector system of claim 15, wherein the air funnels are spaced apart from the cable connectors to define connector gaps, the cables being routed in the connector gaps.

17. The electrical connector system of claim 15, wherein the air funnels each include a front flange at the front of the air funnel, the front flange being held against the panel, the air funnels each having a latch engaging the rear of the panel to secure the air funnel to the panel.

18. The electrical connector system of claim 15, wherein the air funnels each have a rear flange at the rear of the air funnel, the rear flange containing associated cables between the rear flange and the panel.

* * * * *